United States Patent
Higashi et al.

(10) Patent No.: US 7,422,977 B2
(45) Date of Patent: Sep. 9, 2008

(54) COPPER ADHESION IMPROVEMENT DEVICE AND METHOD

(75) Inventors: Kazuyuki Higashi, Yokohama (JP); Masaki Yamada, Yokohama (JP); Noriaki Matsunaga, Chigasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 1 day.

(21) Appl. No.: 11/095,567

(22) Filed: Apr. 1, 2005

(65) Prior Publication Data
US 2006/0121734 A1 Jun. 8, 2006

(30) Foreign Application Priority Data
Dec. 3, 2004 (JP) ............................. 2004-351680

(51) Int. Cl.
*H01L 21/4763* (2006.01)
(52) U.S. Cl. .................. 438/628; 438/687; 438/927; 257/753; 257/751; 257/767; 257/E23.161; 257/E21.021
(58) Field of Classification Search ............... 257/750, 257/751, 753, 763, 687; 438/625, 627, 628, 438/927, 687
See application file for complete search history.

(56) References Cited

U.S. PATENT DOCUMENTS

| | | | | |
|---|---|---|---|---|
| 6,066,196 A | * | 5/2000 | Kaloyeros et al. | 106/1.18 |
| 6,130,161 A | * | 10/2000 | Ashley et al. | 438/687 |
| 6,528,412 B1 | * | 3/2003 | Wang et al. | 438/628 |
| 6,869,871 B1 | * | 3/2005 | Choi | 438/622 |
| 6,908,847 B2 | * | 6/2005 | Saito et al. | 438/627 |
| 6,967,155 B2 | * | 11/2005 | Lin et al. | 438/622 |
| 7,161,200 B2 | * | 1/2007 | Baniecki et al. | 257/295 |
| 2002/0006725 A1 | * | 1/2002 | Farrar | 438/687 |
| 2004/0130030 A1 | * | 7/2004 | Kunimune et al. | 257/758 |
| 2004/0207085 A1 | * | 10/2004 | Fujii et al. | 257/751 |
| 2004/0224507 A1 | * | 11/2004 | Marieb et al. | 438/687 |
| 2005/0153537 A1 | * | 7/2005 | Cheng et al. | 438/627 |
| 2005/0161817 A1 | * | 7/2005 | Meyer et al. | 257/751 |

OTHER PUBLICATIONS

U.S. Appl. No. 11/250,530, filed Oct. 17, 2005, Yamada, et al.
U.S. Appl. No. 10/778,180, filed Feb. 17, 2004, Masaki Yamada, et al.

* cited by examiner

*Primary Examiner*—Jerome Jackson
*Assistant Examiner*—Paul A Budd
(74) *Attorney, Agent, or Firm*—Oblon, Spivak, McClelland, Maier & Neustadt, P.C.

(57) ABSTRACT

A semiconductor device, in which a semiconductor integrated circuit having a multi-level interconnection structure is formed, according to an embodiment of the present invention, comprises a copper wiring and an insulating layer formed on a top surface of the copper wiring, wherein the copper wiring includes an additive for improving adhesion between the copper wiring and the insulating layer, and a profile of the additive has a gradient in which a concentration is gradually reduced as it goes from the top surface of the copper wiring toward the inside thereof, and has the highest concentration on the top surface of the copper wiring.

20 Claims, 9 Drawing Sheets

COPPER ADHESION IMPROVEMENT DEVICE AND METHOD

CROSS-REFERENCE TO RELATED APPLICATIONS

This application is based upon and claims the benefit of priority from prior Japanese Patent Application No. 2004-351680, filed Dec. 3, 2004, the entire contents of which are incorporated herein by reference.

BACKGROUND OF THE INVENTION

1. Field of the Invention

The present invention relates to a semiconductor device such as a memory LSI of which a logic LSI (Logical Large Scale Integrated Circuit), a DRAM (Dynamic Random Access Memory), and an SRAM (Static Random Access Memory) are typical, an LSI configured by a bipolar transistor, or the like.

2. Description of the Related Art

In recent years, as a wiring structure of an LSI, a multi-level interconnection structure using a copper (Cu) damascene wiring (a copper wiring formed by a damascene process) has joined the mainstream due to the demands for making an LSI minute and low-resistant, and the like. Copper wiring generally has higher electro-migration (EM) tolerance at the wiring portion as compared with an aluminum wiring.

Figure 1:
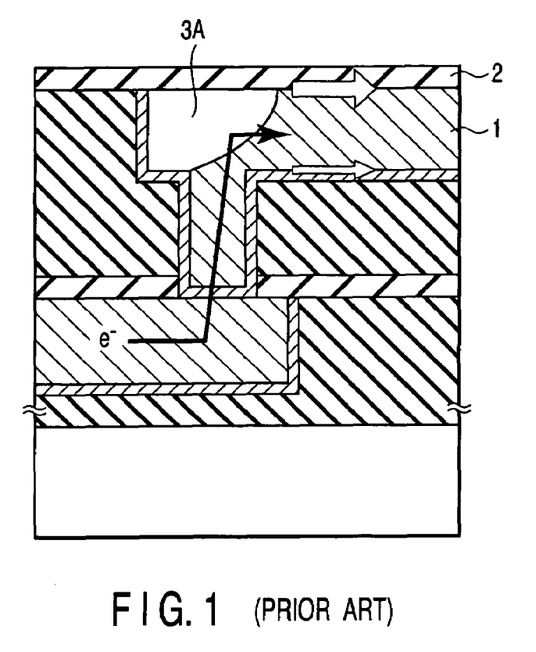
FIG. 1 is a sectional view showing an example of a conventional wiring structure.

(1) However, for example, as shown in FIG. 1, copper wiring 1 has low adhesion with a stopper (an insulating layer) 2 made of SiN, SiCN, SiCO, SiC or the like which is formed on the copper wiring 1 as a layer for preventing copper from diffusing/being oxidized. Therefore, as shown by the arrow, it is the easiest for copper atoms to move at an interface between the copper wiring 1 and the stopper 2, and as a result, a void 3A is easily generated at the interface, and EM tolerance (lifetime) cannot be sufficiently improved.

Figure 2:
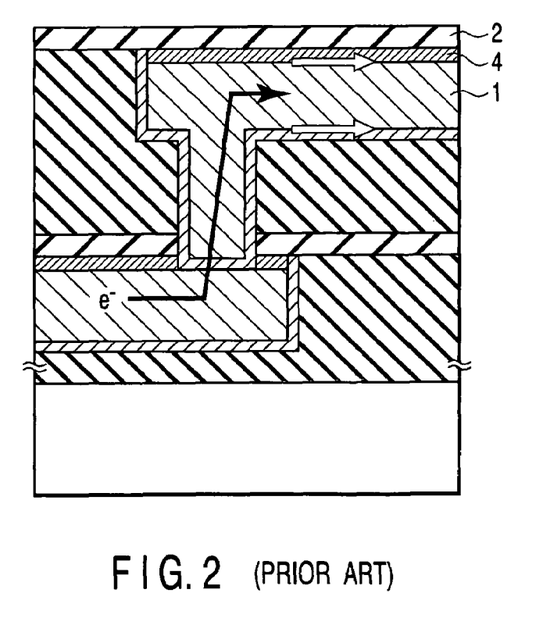
FIG. 2 is a sectional view showing an example of a conventional wiring structure.

To solve such a problem, for example, as shown in FIG. 2, there has been proposed a cap-metal technique in which metal (for example, Co, WP (Tungsten Phosphide), or the like) for improving the adhesion between the copper wiring 1 and the stopper 2 is provided therebetween. In accordance with this technique, the generation of a void at the interface between the copper wiring 1 and the stopper 2 can be suppressed, and the EM tolerance (lifetime) of the copper wiring can be improved.

However, in this technique, a metal 4 must be selectively formed on the copper wiring 1 by using, for example, a CVD method, an electrolytic plating method, or the like, and the problem that technical difficulty with respect to the manufacturing method is made high arises.

Figure 3:
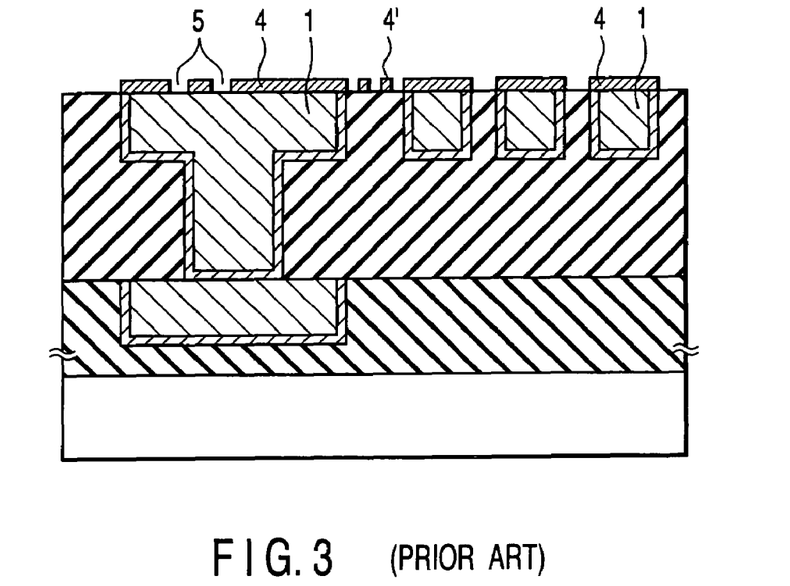
FIG. 3 is a sectional view showing an example of a conventional wiring structure.
Figure 4:
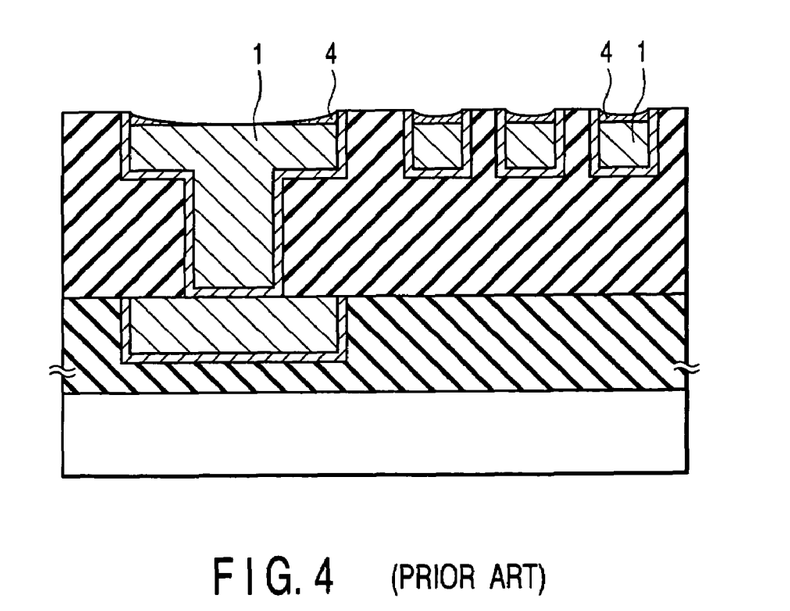
FIG. 4 is a sectional view showing an example of a conventional wiring structure.

For example, as shown in FIG. 3, in accordance with a method in which the metal 4 is selectively made to grow on the copper wiring 1, it is difficult to uniformly form the metal 4 on the copper wiring 1, and there are cases in which pinholes 5 are formed, or metals 4' are formed on portions other than the top of the copper wiring 1 (selectivity disorder). Further, for example, as shown in FIG. 4, in a method in which the metals 4 at the portions other than the top of the copper wiring 1 are removed by CMP after the metal 4 is formed on the entire portion including the top of the copper wiring 1, problems that the copper wiring 1 is exposed due to the metal 4 being overly shaved, or the like arise (over-shaving by CMP).

Figure 5:
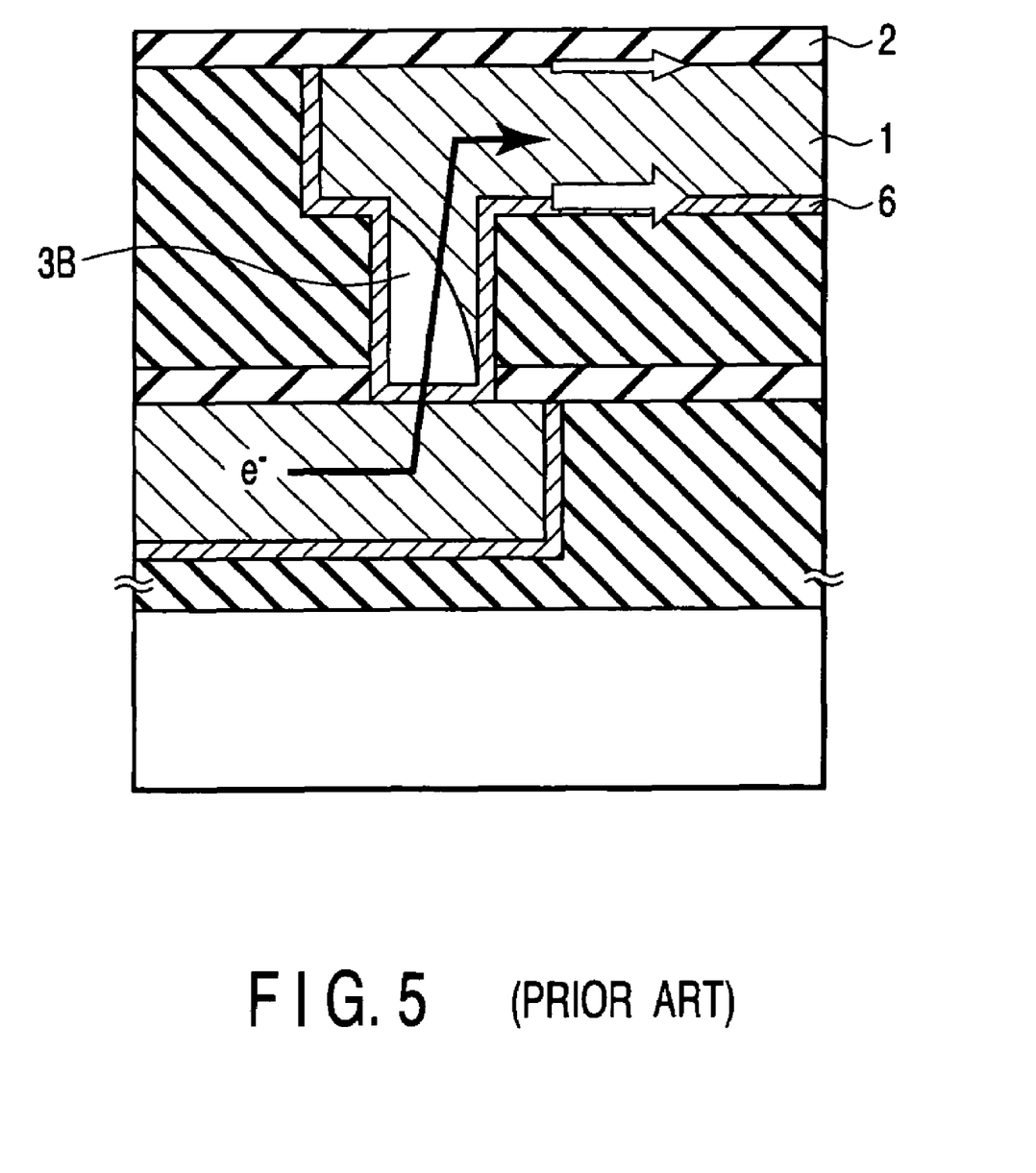
FIG. 5 is a sectional view showing an example of a conventional wiring structure.

(2) Further, recently, for example, as shown in FIG. 5, it has been studied that a barrier metal 6 is formed by a CVD method which has high coverage performance, and which can form a thin film.

However, the barrier metal 6 formed by a CVD method has lower adhesion with respect to the copper wiring 1 as compared with that of a barrier metal formed by a PVD method. Therefore, as shown by the arrow, it is easier for copper atoms to move at the interface between the copper wiring 1 and the barrier metal 6, and as a result, a void 3B is easily generated at the interface, and the EM tolerance (lifetime) cannot be sufficiently improved.

In this way, conventionally, the adhesion between the copper wiring 1 and the stopper 2, and a deterioration in EM tolerance (lifetime) due to a deterioration in the adhesion between the copper wiring 1 and the barrier metal 6 have been the problems. However, the problems cannot be solved without any problem of process.

(3) Further, as another technique for improving an EM tolerance (lifetime), there is a technique in which an additive (for example, metal) for improving the adhesion with a stopper or a barrier metal is included in copper wiring. In this technique, for example, this additive is included in advance in a seed copper serving as a seed layer which will be undercoating at the time of copper plating, and the additive is added into the copper wiring at the same time when the copper wiring is formed.

However, a new problem that, if the additive is uniformly included in the entire copper wiring, the resistance of the copper wiring rises occurs. Namely, the reliability of the wiring (the improvement in the EM tolerance) and a signal delay (a deterioration in wiring resistance) establish the relationship of trade-off, and as a result, a high performance and high reliability multi-level interconnection structure cannot be provided.

BRIEF SUMMARY OF THE INVENTION

An aspect of the present invention is provided to make a proposal of a semiconductor device which can improve the adhesion between a copper wiring and a stopper and the adhesion between a copper wiring and a barrier metal without bringing about a new problem such as a problem on process, a problem of wiring resistance, or the like, and is to make an attempt to improve an EM tolerance of the wiring structuring an LSI.

A semiconductor device, in which a semiconductor integrated circuit having a multi-level interconnection structure is formed, according to a first aspect of the present invention comprises: a copper wiring; and an insulating layer formed on a top surface of the copper wiring, wherein the copper wiring includes an additive for improving adhesion between the copper wiring and the insulating layer, and a profile of the additive has a gradient in which a concentration is gradually reduced as it goes from the top surface of the copper wiring toward an inside thereof, and has the highest concentration at the top surface of the copper wiring.

A semiconductor device, in which a semiconductor integrated circuit having a multi-level interconnection structure is formed, according to a second aspect of the present invention comprises: a copper wiring; a barrier metal which covers side surfaces and bottom surfaces of the copper wiring; a layer of a material solid-soluble in copper which is formed between the copper wiring and the barrier metal, and which includes an additive fused in a solid state in the copper wiring; and an insulating layer formed on a top surface of the copper wiring, wherein the additive fused in a solid state in the top surface, the side surfaces, and the bottom surfaces of the copper wiring is greater than that in an inside thereof.

DETAILED DESCRIPTION OF THE INVENTION

A semiconductor device of an aspect of the present invention will be described below in detail with reference to the accompanying drawing.

1. Outline

In an example of the present invention, first, after a copper damascene wiring is formed in order to improve the adhesion between the copper damascene wiring and a stopper, as a layer for preventing copper from diffusing/being oxidized, which is formed on the copper damascene wiring, for example, SiN, SiCN, SiCO or SiC, an additive which is fused in a solid state in copper and by which the adhesion with the stopper can be improved, for example, Ti (titanium), Al (aluminum), Si (silicon), Co (cobalt), B (boron), or P (phosphor), is injected into the wiring from the top surface of the wiring.

As an injecting method, a method is used in which, after a layer of a material solid-soluble in copper made of a material such as, for example, Ti, Al, Si, Co, B, or P, or a layer of a material solid-soluble in copper including one of those materials as an additive is formed on the copper damascene wiring, the additive is made to diffuse in the copper damascene wiring from the layer of a material solid-soluble in copper due to heat treatment.

Note that portions which have not been fused in a solid state and have remained as the layer of a material solid-soluble in copper even after the heat treatment are removed by RIE, CMP, or the like.

In accordance therewith, a profile of the additive in the copper damascene wiring has a gradient in which the concentration is gradually reduced as it goes from the top surface of the copper damascene wiring (a surface on which the stopper is formed) toward the inside thereof, and has the highest concentration at the top surface of the copper damascene wiring.

Accordingly, the adhesion between the copper damascene wiring and the stopper formed on it is significantly improved, and the EM tolerance (lifetime) as well is improved. Further, provided that diffusion due to heat treatment is used as a method for injecting an additive, the copper damascene wiring having a high EM tolerance (lifetime) can be formed with a simple process without bringing about a new problem.

Note that, in accordance with the copper damascene wiring according to the example of the present invention, even if the inplane density of the additive fused in a solid state in the top surface of the copper damascene wiring and in the vicinity thereof is ununiform, the non-uniformity does not affect the EM tolerance. Further, for example, even when the additive locally exists in quantity at the grain boundary of the copper of the copper damascene wiring, the generation of a void due to the movement of copper atoms, or the like can be effectively suppressed.

Further, in the example of the present invention, secondly, in order to improve the adhesion between the copper damascene wiring and the barrier metal, for example, after a barrier metal is formed, a layer of a material solid-soluble in copper made of an additive which is fused in a solid state in copper and by which the adhesion with the barrier metal can be improved, for example, Ti, Al, Si, Co, B, or P, or a layer of a material solid-soluble in copper including one of those additives is formed on the barrier metal. Then, a copper damascene wiring is formed on the layer of a material solid-soluble in copper.

Accordingly, the layer of a material solid-soluble in copper for improving the adhesion between the both exists between the copper damascene wiring and the barrier metal. As a result, a void generated between the copper damascene wiring and the barrier metal can be effectively prevented, and the EM tolerance (lifetime) can be improved.

Further, for example, when heat treatment is carried out in a vacuum or in an inert gas, the additive in the layer of a material solid-soluble in copper diffuses in the copper damascene wiring, and the additive is separated out in quantity on the top surface (exposed surface) of the copper damascene wiring and in the vicinity thereof. That is, because the additive remains there while deoxidizing copper oxide formed on the top surface of the copper damascene wiring, the density of the additive on the top surface of the copper damascene wiring and in the vicinity thereof is made higher than that at the inside thereof.

Accordingly, the adhesion between the copper damascene wiring and the stopper formed on it can be significantly improved. As a result, a void generated between the both can be effectively prevented, and the EM tolerance (lifetime) can be improved.

In this case, because an injection of the additive is carried out from the barrier metal side, a step of removing the layer of a material solid-soluble in copper is unnecessary, and simplification of the process can be realized.

2. Embodiments

Hereinafter, embodiments which can be considered as the best will be described.

(1) First Embodiment

FIGS. 6 to 11 show a manufacturing method for a semiconductor device according to a first embodiment of the present invention.

Figure 6:
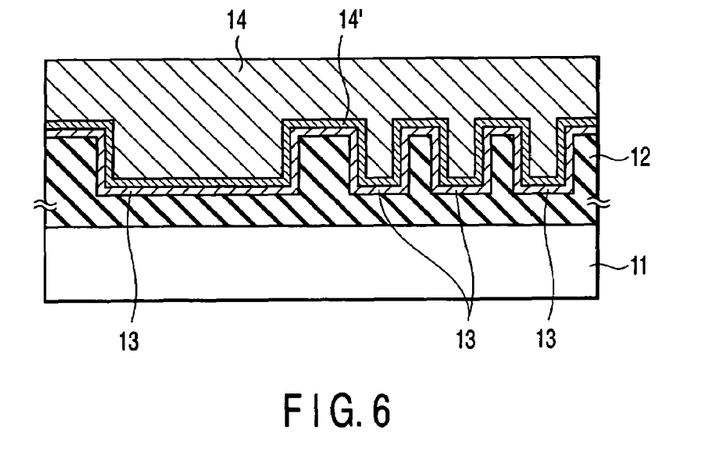
FIG. 6 is a sectional view showing a process of a manufacturing method according to a first embodiment of the present invention.

First, as shown in FIG. 6, a wiring slot is formed on an insulating layer (for example, silicon oxide) 12 on a silicon substrate 11 by using a method such as, for example, PEP (Photo Engraving Process), or RIE (Reactive Ion Etching).

A barrier metal 13 for covering the bottom surfaces and the side surfaces of the wiring slot is formed on the insulating layer 12 by using a method such as a CVD method or a PVD method. Next, a seed copper (seed-Cu) 14' serving as a seed layer which will be undercoating at the time of copper plating is formed on the barrier metal 13 by, for example, a sputtering method. Thereafter, a copper plate layer 14 having a sufficient thickness for filling up the wiring slot is formed on the seed copper 14' by using, for example, an electrolytic plating method.

Note that, after the process of copper plating, the seed copper 14' is integrated with the copper plate layer 14 to be a part of the copper plate layer 14.

Figure 7:
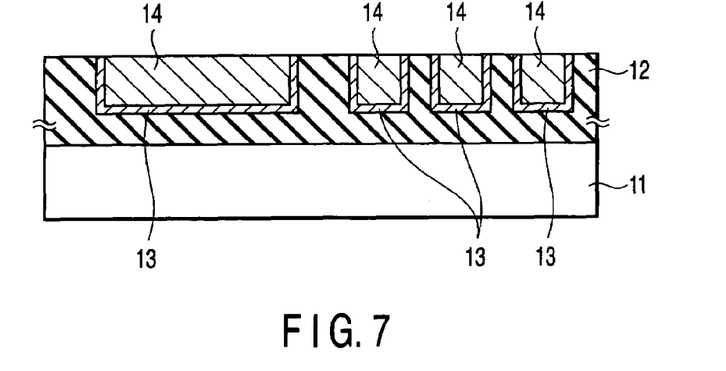
FIG. 7 is a sectional view showing a process of the manufacturing method according to the first embodiment.

Next, as shown in FIG. 7, the copper plate layer 14 existing outside the wiring slot is removed, by using a method such as, CMP (Chemical Mechanical Polishing) or RIE, the copper plate layer 14 is left only in the wiring slot, and this is set as copper damascene wiring. At this time, the barrier metal 13 existing outside the wiring slot as well is removed.

Figure 8:
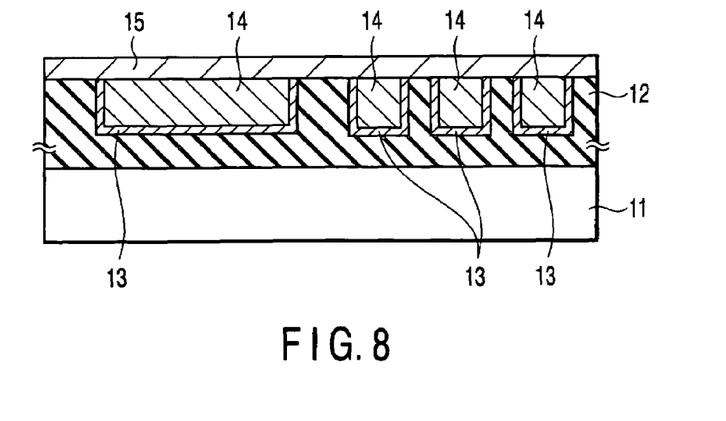
FIG. 8 is a sectional view showing a process of the manufacturing method according to the first embodiment.

Next, as shown in FIG. 8, a layer 15 of a material solid-soluble in copper made of an additive which is fused in a solid state in copper, and by which the adhesion with a stopper which will be described later (an insulating layer of SiN, SiCN, SiCO, SiC or the like) can be improved, for example, Ti (titanium), Al (aluminum), Si (silicon), Co (cobalt), B (boron), or P (phosphorus), or the layer 15 of a material solid-soluble in copper including one of those additives is formed on the insulating layer 12 and the copper damascene wiring 14 by using, for example, a sputtering method.

Figure 9:
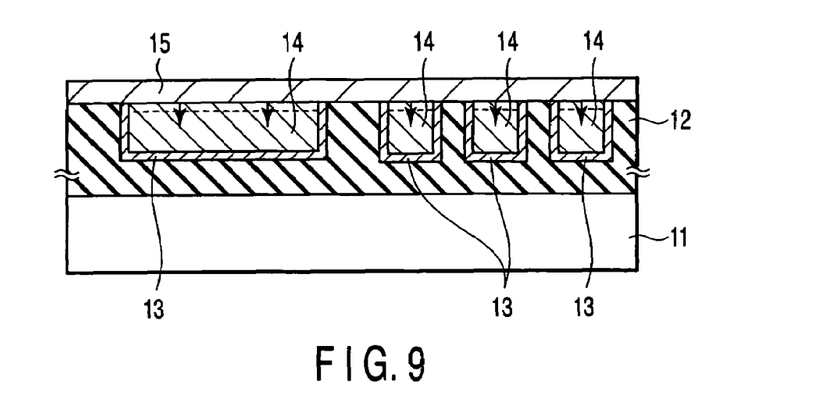
FIG. 9 is a sectional view showing a process of the manufacturing method according to the first embodiment.

Next, as shown in FIG. 9, the additive in the layer 15 of a material solid-soluble in copper is made to diffuse in the copper damascene wiring 14 due to heat treatment. In accordance with this thermal diffusion, the additive in the layer 15 of a material solid-soluble in copper is fused in a solid state in the copper damascene wiring 14, and the profile thereof has a gradient in which the concentration is gradually reduced as it goes from the top surface of the copper damascene wiring 14 toward the inside thereof, and has the highest concentration at the top surface of the copper damascene wiring 14.

Note that, with respect to the diffusion of the additive into the copper damascene wiring 14, in place of the heat treatment, for example, in a sputtering process shown in FIG. 8, the additive in the layer 15 of a material solid-soluble in copper may be made to diffuse in the copper damascene wiring 14, at the same time when the layer 15 of a material solid-soluble in copper is formed, by controlling a temperature at the time of forming the layer 15 of a material solid-soluble in copper.

Further, such a diffusion process at the time of forming the layer 15 of a material solid-soluble in copper and a diffusion process due to heat treatment may be combined.

Figure 10:
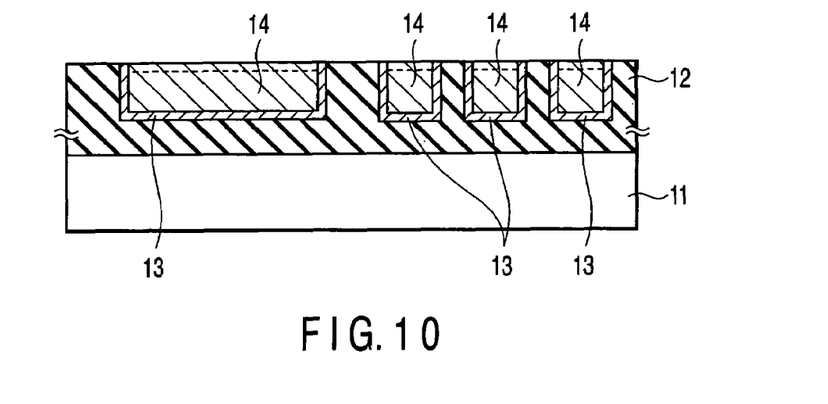
FIG. 10 is a sectional view showing a process of the manufacturing method according to the first embodiment.

Next, as shown in FIG. 10, the layer 15 of a material solid-soluble in copper which has not been fused in a solid state and which has remained on the insulating layer 12 and the copper damascene wiring 14 is removed by using a method such as, for example, wet-etching using HF or the like, RIE using a CF gas or a Cl gas, CDE (Chemical Dry Etching) or CMP.

Figure 11:
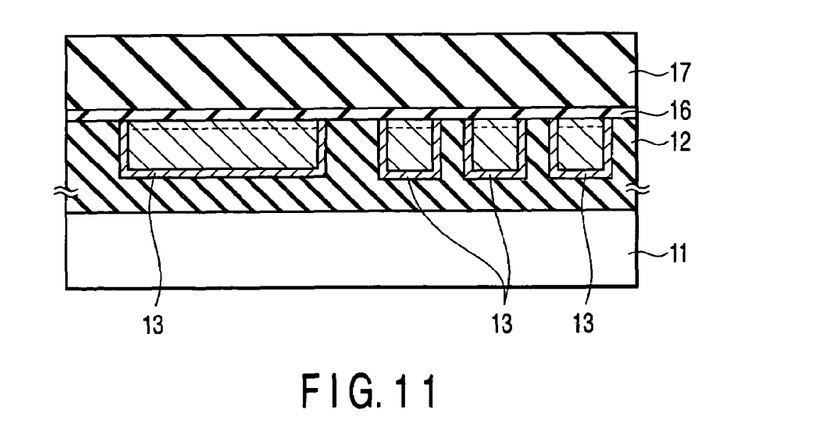
FIG. 11 is a sectional view showing a process of the manufacturing method according to the first embodiment.

Next, as shown in FIG. 11, a stopper 16 made of SiN, SiCN, SiCO, SiC or the like is formed on the insulating layer 12 and the copper damascene wiring 14. Here, because the additive for improving the adhesion with the stopper 16 is included in quantity in the top surface of the copper damascene wiring 14 and in the vicinity thereof, the adhesion between the copper damascene wiring 14 and the stopper 16 is made satisfactory.

Thereafter, an insulating layer (for example, silicon oxide or the like) 17 having a sufficient thickness is formed on the stopper 16 by, for example, a CVD method.

As described above, in accordance with the manufacturing method according to the first embodiment, before the stopper 16 is formed on the copper damascene wiring 14, the additives for improving the adhesion between the copper damascene wiring 14 and the stopper. 16 is made to be fused in a solid state in quantity in the top surface of the copper damascene wiring 14 and in the vicinity thereof in advance. Accordingly, the copper damascene wiring 14 having a high EM tolerance (lifetime) can be formed with a simple process.

Figure 12:
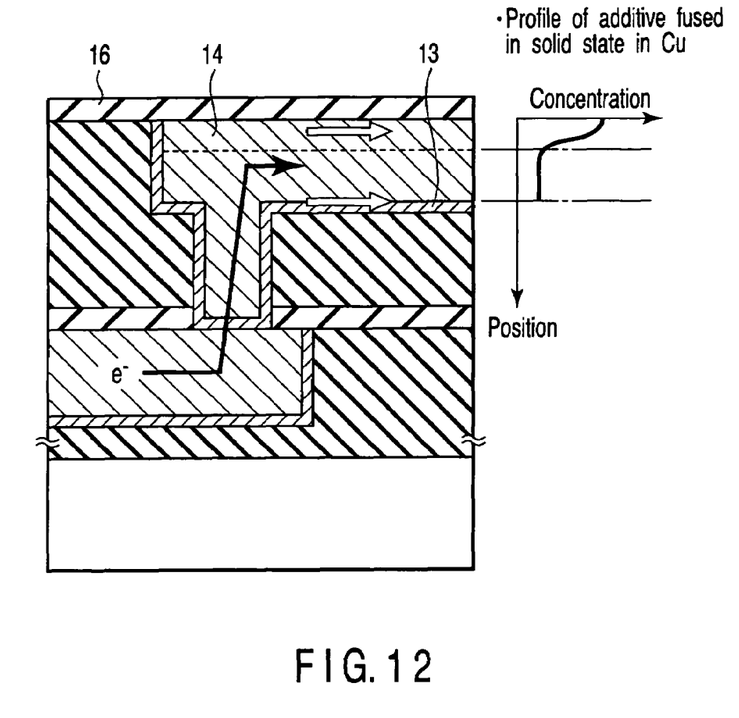
FIG. 12 is a sectional view showing a feature of a wiring structure according to the first embodiment.
Figure 13:
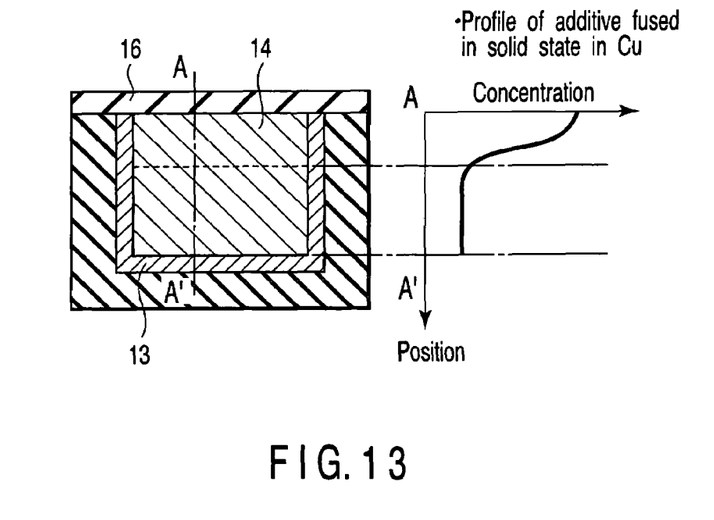
FIG. 13 is a sectional view showing a feature of the wiring structure according to the first embodiment.

Further, with respect to the semiconductor device manufactured by the manufacturing method according to the first embodiment, for example, as shown in FIGS. 12 and 13, the profile of the additive in the copper damascene wiring 14 has a gradient in which the concentration is gradually reduced as it goes from the top surface of the copper damascene wiring 14 toward the inside thereof, and has the highest concentration at the top surface of the copper damascene wiring 14.

Namely, the semiconductor device manufactured by the manufacturing method according to the first embodiment has a feature which is different from that of the semiconductor device having a cap-metal structure as shown in FIG. 2 to the extent that the profile of the additive in-the copper damascene wiring 14 varies with a specific gradient.

(2) Second Embodiment

FIGS. 14 to 17 show a manufacturing method for a semiconductor device according to a second embodiment of the present invention.

Figure 14:
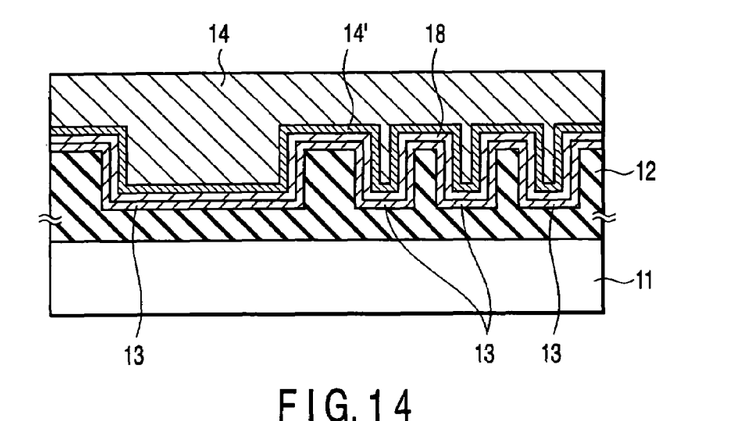
FIG. 14 is a sectional view showing a process of a manufacturing method according to a second embodiment of the present invention.

First, as shown in FIG. 14, a wiring slot is formed on the insulating layer (for example, silicon oxide) 12 on the silicon substrate 11 by using a method such as, for example, PEP or RIE.

The barrier metal 13 for covering the bottom surfaces and the side surfaces of the wiring slot is formed on the insulating layer 12 by using a method such as a CVD method or a PVD method.

Thereafter, a layer 18 of a material solid-soluble in copper made of an additive which is fused in a solid state in copper, and by which the adhesion with the barrier metal 13 and a stopper (an insulating layer of SiN, SiCN, SiCO, SiC or the like) which will be described later can be improved, for example, Ti, Al, Si, Co, B or P, or the layer 18 of a material solid-soluble in copper including one of those additives is formed on the barrier metal 13 by using, for example, a sputtering method.

Subsequently, the seed copper (seed-Cu) 14' serving as a seed layer which will be undercoating at the time of copper plating is formed on the layer 18 of a material solid-soluble in copper by a sputtering method. Then, copper plate layer 14 having a sufficient thickness for filling up the wiring slot is formed on the seed copper 14' by using, for example, an electrolytic plating method.

Note that, after the process of copper plating, the seed copper 14' is integrated with the copper plate layer 14 to be a part of the copper plate layer 14.

Figure 15:
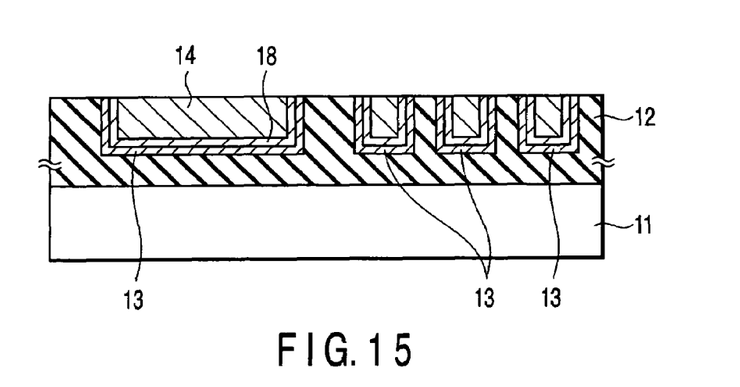
FIG. 15 is a sectional view showing a process of the manufacturing method according to the second embodiment.

Next, as shown in FIG. 15, the copper plate layer 14 existing outside the wiring slot is removed by using a method such as, for example, CMP or RIE, and the copper plate layer 14 is left only in the wiring slot, and this is set as copper damascene wiring. At this time, the barrier metal 13 and the layer 18 of a material solid-soluble in copper existing outside the wiring slot as well are removed.

Figure 16:
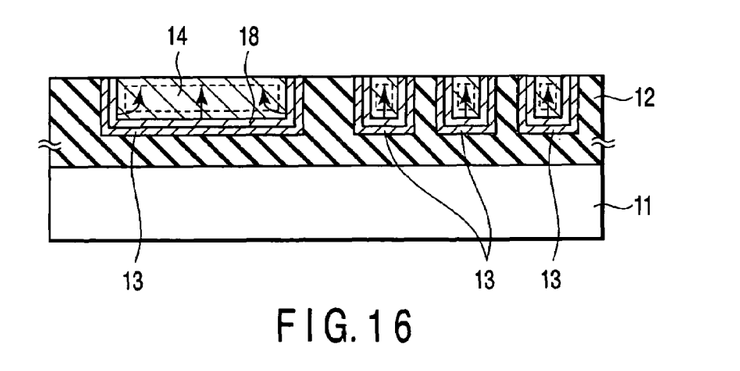
FIG. 16 is a sectional view showing a process of the manufacturing method according to the second embodiment.

Next, as shown in FIG. 16, the additive in the layer 18 of a material solid-soluble in copper is made to diffuse in the copper damascene wiring 14 due to heat treatment being carried out, for example, in a vacuum or in an inert gas, and is separated out on the top surface (exposed surface) of the copper damascene wiring 14 and in the vicinity thereof.

In this heat treatment, the additive (for example, Ti) from the inside of the layer 18 of a material solid-soluble in copper deoxidizes the copper oxide formed on the top surface of the copper damascene wiring 14 due to the additive itself being oxidized by (for example, in a case of Ti, due to the Ti being made to be TiOx). Therefore, the additive remains as oxide at the top surface of the copper damascene wiring 14 and in the vicinity thereof.

Accordingly, the density of the additive on the top surface of the copper damascene wiring 14 and in the vicinity thereof is made higher than that of the inside thereof.

Figure 17:
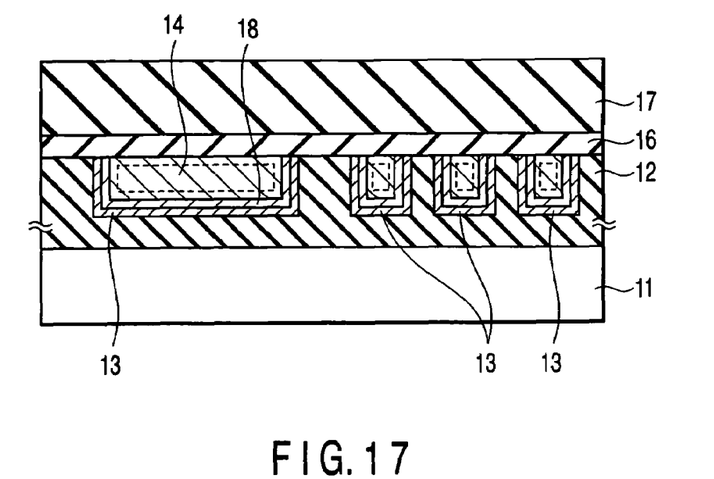
FIG. 17 is a sectional view showing a process of the manufacturing method according to the second embodiment.

Next, as shown in FIG. 17, the stopper 16 made of SiN, SiCN, SiCO, SiC or the like is formed on the insulating layer 12 and the copper damascene wiring 14 by using, for example, a CVD method. Here, because the additive for improving the adhesion with the stopper 16 is included in quantity in the top surface of the copper damascene wiring 14 and in the vicinity thereof, the adhesion between the copper damascene wiring 14 and the stopper 16 is made satisfactory.

Thereafter, the insulating layer (for example, silicon oxide or the like) 17 having a sufficient thickness is formed on the stopper 16 by, for example, a CVD method.

As described above, in accordance with the manufacturing method according to the second embodiment, the layer 18 of a material solid-soluble in copper for improving the adhesion between the barrier metal 13 and the copper damascene wiring 14 is formed therebetween. Accordingly, the adhesion between the barrier metal 13 and the copper damascene wiring 14 can be improved, and the copper damascene wiring 14 having a high EM tolerance (lifetime) can be provided.

Further, in accordance with the manufacturing method according to the second embodiment, the additive in the layer 18 of a material solid-soluble in copper is made to diffuse in the copper damascene wiring 14 by heat treatment, and the additive is separated out in quantity on the top surface and in the vicinity thereof. The additive is hardly separated out at the inside (central portion) of the copper damascene wiring 14, and is separated out in quantity at the all sides thereof (the top surface, the side surfaces, and the bottom surface). Therefore, there is no rise in wiring resistance, and a high performance and high reliability wiring structure can be provided.

Moreover, in accordance with the second embodiment, because the process in which the layer 18 of a material solid-soluble in copper remaining after heat treatment is removed as in the first embodiment is not necessary, there is no large change in the manufacturing method, which can contribute to a reduction in the cost.

Figure 18:
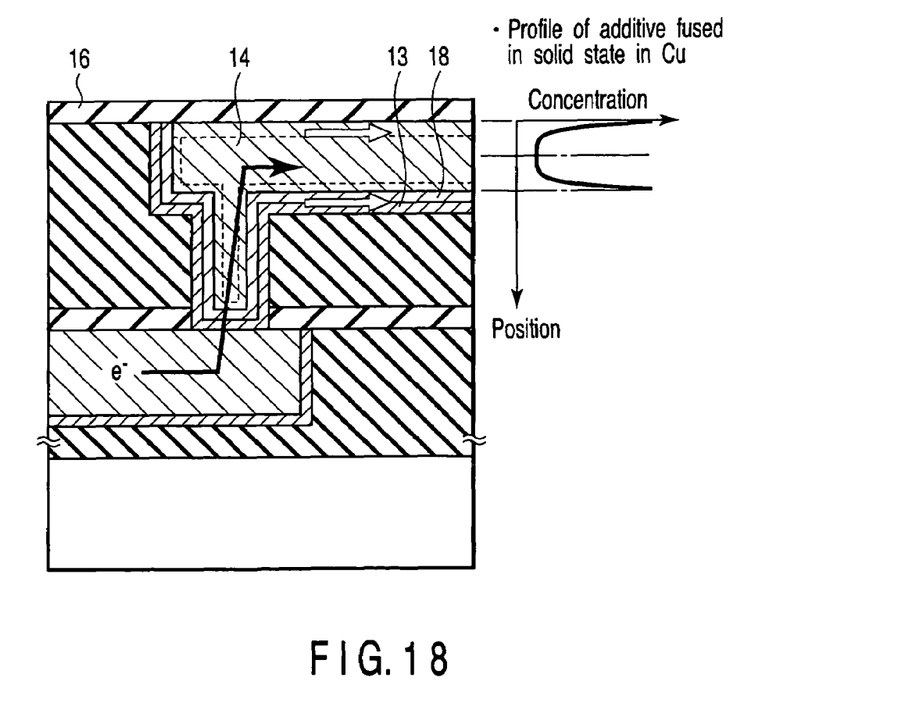
FIG. 18 is a sectional view showing a feature of a wiring structure according to the second embodiment.
Figure 19:
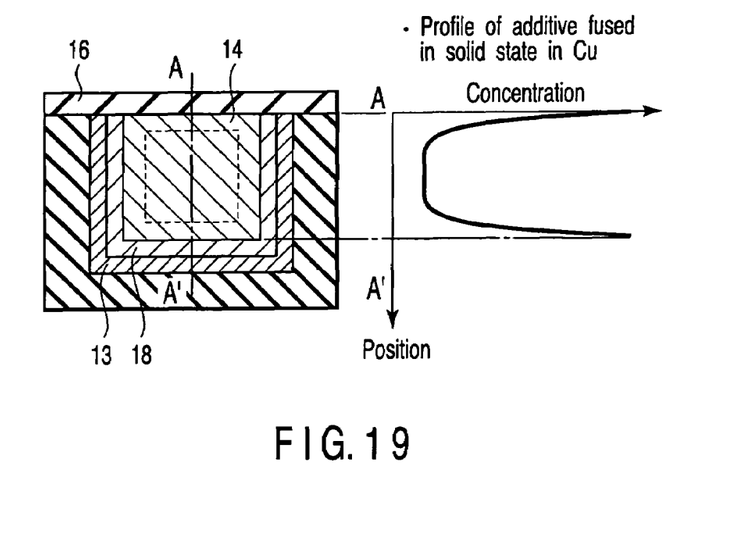
FIG. 19 is a sectional view showing a feature of the wiring structure according to the second embodiment.

Note that with respect to the semiconductor device manufactured by the manufacturing method according to the second embodiment, for example, as shown in FIGS. 18 and 19, the additive fused in a solid state in the all sides (the top surface, the side surfaces, and the bottom surface) of the copper damascene wiring 14 is greater than that fused in a solid state in the inside thereof.

In the semiconductor device according to the second embodiment has a feature which is different from that of the semiconductor device having a cap-metal structure as shown in FIG. 2 to the extent that the profile of the additive in the copper damascene wiring 14 varies with a specific gradient.

3. Others

In accordance with the copper damascene wiring according to the example of the present invention, even if the inplane density (concentration) of the additive fused in a solid state in the top surface of the copper damascene wiring and in the vicinity thereof is ununiform, the non-uniformity does not affect the EM tolerance.

Figure 20:
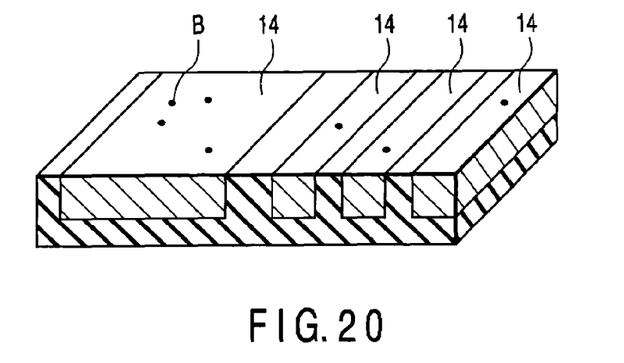
FIG. 20 is a diagram showing non-uniformity in the density of an additive in the vicinity of a surface of a wiring.

For example, as shown in FIG. 20, even if portions B with low densities of the additive (shown by black spots) exist on the top surface of the copper damascene wiring 14 and in the vicinity thereof, there does not occur the case where no additive exist at all as the cases of the pinholes (FIG. 3) and the over-shaving (FIG. 4). Therefore, the effect of an improvement in the EM tolerance is not influenced at all.

Figure 21:
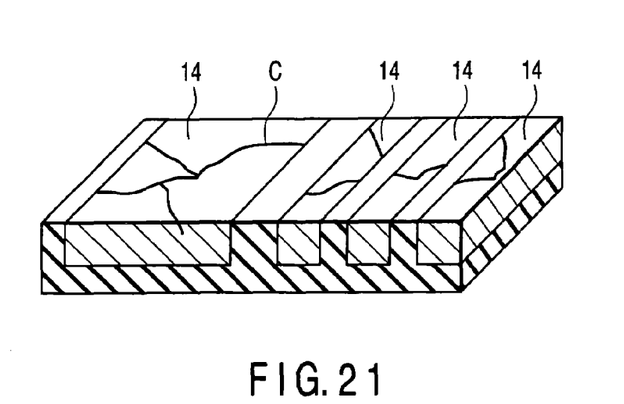
FIG. 21 is a diagram showing non-uniformity in the density of an additive in the vicinity of the surface of the wiring.

Moreover, for example, as shown in FIG. 21, even when the additive locally exists in quantity at grain boundaries (shown by black lines) C of the copper in the copper damascene wiring 14, the additive always exists in the top surface of the copper damascene wiring 14 and in the vicinity thereof. Accordingly, generation of a void due to the movement of copper atoms, or the like can be effectively suppressed without any effect on the EM tolerance.

The first and second embodiments have been described with the copper damascene wiring being as the example. However, the example of the present invention can be applied to an example in which the copper wiring is formed by a method other than a damascene process, for example, PEP and RIE.

The example of the present invention can be applied to various LSIs such as a logic LSI, a memory LSI including a DRAM and an SRAM, an LSI configured by a bipolar transistor, and the like.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device having a multi-level interconnection type semiconductor integrated circuit, comprising:
   a copper wiring; and
   an insulating layer formed on a top surface of the copper wiring, wherein the copper wiring includes an additive for improving adhesion between the copper wiring and the insulating layer, and a profile of the additive has a gradient in which a concentration is gradually reduced as it goes from the top surface of the copper wiring toward an inside thereof, has the highest concentration at the top surface of the copper wiring, and the concentration of additive at the bottom surface of the copper wiring is substantially lower than the concentration of additive at the top surface of the copper wiring.

2. The semiconductor device according to claim 1, wherein a density of the additive at the top surface of the copper wiring is ununiform.

3. The semiconductor device according to claim 2, wherein portions in which the density of the additive is low exist locally at the top surface of the copper wiring.

4. The semiconductor device according to claim 2, wherein at the top surface of the copper wiring, the additive exists locally in quantity at grain boundaries of copper of the copper wiring.

5. The semiconductor device according to claim 1, wherein the insulating layer is made of a material having a function of preventing the copper configuring the copper wiring from diffusing or being oxidized.

6. The semiconductor device according to claim 5, wherein the material is one of SiN, SiCN, SiCO and SiC.

7. The semiconductor device according to claim 1, wherein the additive is one of Ti, Al, Si, Co, B, and P.

8. A semiconductor device having a multi-level interconnection type semiconductor integrated circuit, comprising:
a copper wiring;
a barrier metal which covers side surfaces and a bottom surface of the copper wiring;
a layer of a material solid-soluble in copper which is formed between the copper wiring and the barrier metal, and which includes an additive fused in a solid state in the copper wiring; and
an insulating layer formed on a top surface of the copper wiring,
wherein the additive fused in a solid state in the top surface, the side surfaces, and the bottom surface of the copper wiring is greater than that in an inside thereof.

9. The semiconductor device according to claim 8, wherein a density of the additive at the top surface of the copper wiring is ununiform.

10. The semiconductor device according to claim 9, wherein portions in which the density of the additive is low exist locally at the top surface of the copper wiring.

11. The semiconductor device according to claim 9, wherein at the top surface of the copper wiring, the additive exists locally in quantity at grain boundaries of copper of the copper wiring.

12. The semiconductor device according to claim 8, wherein the insulating layer is made of a material having a function of preventing the copper structuring the copper wiring from diffusing or being oxidized.

13. The semiconductor device according to claim 12, wherein the material is one of SiN, SiCN, SiCO and SiC.

14. The semiconductor device according to claim 8, wherein the additive is one of Ti, Al, Si, Co, B, and P.

15. A manufacturing method for a semiconductor device, comprising:
forming a copper wiring;
forming a layer of a material solid-soluble in copper including an additive fused in a solid state in the copper wiring, on a top surface of the copper wiring;
removing the layer of a material solid-soluble in copper after the additive is made to fuse in a solid state in the copper wiring due to heat treatment; and
forming an insulating layer on the top surface of the copper wiring,
wherein a profile obtained due to the heat treatment has a gradient in which a concentration is gradually reduced as it goes from the top surface of the copper wiring toward an inside thereof, and has the highest concentration at the top surface of the copper wiring.

16. The manufacturing method according to claim 15, wherein the copper wiring is formed by an electrolytic plating method.

17. The manufacturing method according to claim 15, wherein the additive is one of Ti, Al, Si, Co, B, and P.

18. A manufacturing method for a semiconductor device, comprising:
forming a barrier metal in a wiring slot;
forming a layer of a material solid-soluble in copper including an additive on the barrier metal;
forming a copper wiring which fills up the wiring slot on the layer of a material solid-soluble in copper;
fusing the additive in a solid state in the copper wiring due to heat treatment; and
forming an insulating layer on a top surface of the copper wiring after said fusing the additive,
wherein the additive fused in a solid state in the top surface, side surfaces, and a bottom surface of the copper wiring is greater than that in an inside thereof.

19. The manufacturing method according to claim 18, wherein the copper wiring is formed by an electrolytic plating method.

20. The manufacturing method according to claim 18, wherein the additive is one of Ti, Al, Si, Co, B, and P.

* * * * *